United States Patent
Fujisawa et al.

(10) Patent No.: US 6,642,605 B2
(45) Date of Patent: Nov. 4, 2003

(54) SEMICONDUCTOR DEVICE AND A PROCESS FOR PRODUCING SAME

(75) Inventors: Tomotaka Fujisawa, Tokyo (JP); Chihiro Arai, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/162,244

(22) Filed: Jun. 4, 2002

(65) Prior Publication Data

US 2003/0116821 A1 Jun. 26, 2003

Related U.S. Application Data

(62) Division of application No. 09/483,913, filed on Jan. 18, 2000, now Pat. No. 6,445,057.

(30) Foreign Application Priority Data

Jan. 18, 1999 (JP) ............................................. 11-009831
Jan. 6, 2000 (JP) ........................................ 2000-000566

(51) Int. Cl.[7] .............................................. H01L 29/00
(52) U.S. Cl. ........................ 257/547; 257/372; 257/302
(58) Field of Search ................................ 257/547, 372, 257/302

(56) References Cited

U.S. PATENT DOCUMENTS

| 4,611,178 A | * | 9/1986 | Naylor et al. ................ 330/272 |
| 5,225,359 A | * | 7/1993 | DeLong ....................... 438/328 |
| 5,516,718 A | * | 5/1996 | Lee ............................. 438/202 |
| 5,519,313 A | * | 5/1996 | Wong et al. ................. 323/315 |
| 5,624,853 A | * | 4/1997 | Shikata ........................ 438/105 |

* cited by examiner

*Primary Examiner*—David Nelms
*Assistant Examiner*—Tu-Tu Ho
(74) *Attorney, Agent, or Firm*—Sonnenschein, Nath & Rosenthal LLP

(57) ABSTRACT

In a semiconductor device having a junction type diode using a bipolar transistor and a process for producing the same, a ratio of a diode electric current to a leakage electric current is improved, and latch up resistance is improved without increasing the process. A p type semiconductor substrate, a collector buried region and an n type epitaxial layer are formed, a p type first impurity region is formed in the n type epitaxial layer, an n type second impurity region is formed in the first impurity region, an N⁺ sinker is formed, and a collector electrode is formed, with a common electrode being formed on the first and second impurity regions.

17 Claims, 13 Drawing Sheets

Vc = 20.0v (CONS.)

SEMICONDUCTOR DEVICE AND A PROCESS FOR PRODUCING SAME

CROSS REFERENCE TO RELATED APPLICATIONS

The applicants claim priority to and the benefit of the following applications: Japanese Application No. P11-009831 (filed Jan. 18, 1999); Japanese Application No. P2000-000566 (filed Jan. 06, 2000) and this application is a division of U.S. application Ser. No. 09/483,913 (filed Jan. 18, 2000); now U.S. Pat. No. 6,445,057 the disclosures of which are expressly incorporated herein to the extent permissible by law.

FIELD OF THE INVENTION

The present invention relates to a semiconductor device having a bipolar transistor and a process for producing the same, and more particularly to a semiconductor device, in which a (planar) junction type diode is constructed by using impurity regions of a vertical npn bipolar transistor, a horizontal pnp bipolar transistor, and an electrode wiring, and a process for producing the same.

BACKGROUND OF THE INVENTION

FIG. 1 shows a structure of a semiconductor device of a planar junction type diode using a vertical npn bipolar transistor.

In the semiconductor device having a vertical npn bipolar transistor, an n type high concentration collector buried region (N-BL; N-buried layer) 209 is constructed in a p type semiconductor substrate (P-sub) 206, and an ISO 208 called a channel stopper is constructed in an outer periphery thereof by p type high concentration diffusion in the vertical direction, so that the elements are physically or electrically isolated.

On an upper part of the channel stopper of the p type high concentration impurity region ISO 208, an insulating layer constructed with a silicon oxide film (or an element isolating region, LOCOS; local oxidation of silicon) 207 is further formed. In the region surrounded by the LOCOS 207, elements, such as a transistor, are formed.

On an upper part of the n type high concentration collector buried region 209, an n type epi layer (n type epitaxial layer, or an N-epi layer) 202 is constructed, which is formed by epitaxial growth.

In the n type epitaxial layer 202, a p type intrinsic base region (described as an intrinsic base region or simply as a base region) 201 is constructed. Inside the intrinsic base region 201, an n type high concentration emitter region 203, in which an n type impurity is diffused, is constructed.

Next, on the both ends of the collector buried region 209 to the surface of the epitaxial layer 202, an N+ sinker (PLG; plug) 205 of a high concentration of an n type impurity is constructed to decrease the collector resistance.

Furthermore, over the whole upper surface of the p type semiconductor substrate 206, insulating films 212 and 213 comprising $SiO_2$ are accumulated, with electrode windows for the emitter region 203, base region 201 and N⁻ sinker 205 constituting a part of collector region being opened, respectively.

On an upper part of the N+ sinker 205 for withdrawing the collector electrode, a metallic electrode film, such as Al, is accumulated along with a base metallic electrode film (sometimes simply referred to as a base electrode) 210 and an emitter metallic electrode film (sometimes simply referred to as an emitter electrode) 214, to constitute a collector metallic electrode film (sometimes simply referred to as a collector electrode) 215. An interlevel insulating film, an upper layer wiring layer are formed on an upper part of the metallic electrode film to constitute an integrated circuit.

As an example using as a circuit where a planar junction type diode is constructed by using the vertical npn bipolar transistor described above, as shown in FIG. 1, a constant bias voltage Vf is applied to the base metallic electrode film 210, the emitter metallic electrode film 214 is made open, and the collector metallic electrode film 215 is connected to the circuit, so as to realize a diode using the base/collector electrodes.

A specific example of an equivalent circuit of the diode constructed by the structure is shown in FIG. 2.

In order to reduce the influence of the parasitic pnp bipolar transistor, as shown in FIG. 1, the P-sub 206 is separated by the collector buried region (N-BL) 209 and the N+ sinker (PLG) 205 of the collector electrode withdrawing region, but it is not sufficient thereby.

The results thereof are shown in FIG. 3. The abscissa is the applied voltage supplied to the base electrode 210 (sometimes referred to as a bias voltage) Vf, which is graduated from 20.5 V to 22.5 V by a step of 0.5 V, and the ordinate indicates the electric current Ic flowing in the collector electrode 215 and the leakage electric current Isub flowing in the P-sub 206, which is graduated in a logarithmic scale in the range of from 0.01 $\mu$A to 100 $\mu$A.

As shown in FIG. 1 and FIG. 2, however, in the related art planar PN junction type diode using the base/collector junction of the vertical npn bipolar transistor, in the case where the bias voltage is applied to the normal direction, a parasitic pnp bipolar transistor generated between an N-epi layer 202 forming the base region (201) to the collector region of the transistor and the N-BL 209 to the P-sub (206) functions, and thus a leakage electric current (Isub) flowing (leaking) toward the P-sub (206) is generated.

In particular, in the case where trimming with a large electric potential difference between the base region (201) and the P-sub (206) (zapping voltage≅Bvbso) is conducted, the necessary electric current must flow in the normal direction on the Zener zap diode. At this time, a leakage electric current flowing toward the P-sub 206 is generated, and the possibility of forming latch up due to the leakage electric current is increased. The consuming electric power also becomes large as a matter of course.

When the applied voltage vf supplied to the base electrode of the vertical npn transistor is 21.0 V, the collector electric current Ic is about 1.5 $\mu$A, and the leakage electric current Isub is 4.5 $\mu$A, i.e., the leakage electric current is larger. When the applied voltage vf becomes 21.5 V, Ic is 18 $\mu$A, and Isub is 30 $\mu$A, i.e., Isub is larger. Furthermore, when the applied voltage Vf becomes 22 V, Ic and Isub are substantially the same, which are about 40 $\mu$A.

As described herein, in the junction type diode having the structure shown in FIG. 1, the leakage electric current Isub flowing in the P-sub 206 is equivalent to or larger than the electric current Ic flowing in the diode, and thus the leakage electric current is large. That is, the necessary potential difference required for zapping to the Zener zap diode cannot be obtained, and the zapping cannot be certainly conducted. In order to reduce the influence ($h_{FE}$) of the parasitic pnp transistor, the collector ring structure is employed, as shown in FIG. 1, in which the gap between the p type substrate and the collector is surrounded by the high concentration n⁺ layer by using the n type buried layer (N-BL) 209 and the collector electric current withdrawing (plug) layer 205, but it cannot be sufficient countermeasure.

SUMMARY OF THE INVENTION

The invention relates to a semiconductor device and a process for producing the same, by which the problems associated with the conventional techniques are solved.

A first semiconductor device is equipped with a trimming circuit having a Zener zap diode, the semiconductor device comprising a diode between a terminal for applying a voltage used on trimming the trimming circuit and the Zener zap diode, the diode comprising a first region of a first conductive type and a second region of a second conductive type formed on a substrate, the diode further comprising a third region of the second conductive type in at least a part of the first region, the third region being separated from the second region by the first region, and the third region being connected to the first region with wiring.

The first semiconductor device has a pn junction diode using a base/collector junction of an npn transistor, and by connecting the emitter (the third region) and the base (the first region) by wiring (EB short), the npn transistor is operated in reverse, to increase the collector electric current (Ic). By such a manner, the ratio of Ic becomes large with respect to the leakage electric current (Isub) leaking to the side of the p type substrate. As a result, when the Ic is constant, the leakage electric current (Isub) leaking to the side of the p type substrate is decreased. When the comparison of the ratio Ic/Isub is conducted for the case of emitter-base (EB) open and the case of emitter-base (EB) short by using an npn transistor having a collector ring structure, Ic≅Isub in the case of emitter-base open, whereas Isub is decreased to 1/7 to 1/10 of Ic in the case of emitter-base short, to exhibit apparent effects.

A second semiconductor device is equipped with a trimming circuit having a Zener zap diode, the semiconductor device comprising a diode between a terminal for applying a voltage used on trimming the trimming circuit and the Zener zap diode, the diode comprising a first region of a first conductive type and a second region of a second conductive type formed on a substrate, the diode further comprising a third region of the second conductive type in at least a part of the first region, the third region being separated from the second region by the first region, the diode further comprising a fourth region of the first conductive type in at least in a part of the second region, the fourth region being separated from the first region by the second region, the third region being connected to the first region with wiring, and the fourth region being connected to the second region with wiring.

The second semiconductor device has a structure combining the first semiconductor device and a third semiconductor device described later, and employs the structure, in which a base 2 (the fourth region) is provided between the base (the first region) and the collector (the second region) of the npn transistor. The collector (the second region) and the base 2 (the fourth region) form a short circuit, and the emitter (the third region) and the base (the first region) also form a short circuit. By such a structure, the Isub (leakage of an electric current to the p type substrate) is suppressed owing to the synergistic effect of the first semiconductor device and the third semiconductor device described later.

A third semiconductor device is equipped with a trimming circuit having a Zener zap diode, the semiconductor device comprising a diode between a terminal for applying a voltage used on trimming the trimming circuit and the Zener zap diode, the diode comprising a first region of a first conductive type formed on a type and a second region of a second conductive type formed in the first region, the diode further comprising a third region of the second conductive type in at least a part of the first region, the third region being separated from the second region and other regions of the second conductive type by the first region, and the third region is connected to the first region with wiring.

The third semiconductor device employs connection of the emitter (the third region) and the base (the first region) of the horizontal pnp transistor, and the collector (the second region) and the base (the first region) are connected (short circuit) with wiring. By such a manner, the Ic can be increased by operating the horizontal pnp transistor, and the ratio of Ic with respect to the leakage electric current (Isub) leaking to the side of the p type substrate is increased. As a result, when the Ic is constant, the amount of Isub is decreased. When the comparison of the ratio Ic/Isub is conducted for the case of collector-base (CB) open and the case of collector-base (CB) short by using the horizontal pnp transistor, Ic≅Isub in the case where the collector-base of the npn transistor is emitter-base open, whereas Isub is decreased to 1/7 to 1/10 of Ic in the case of collector-base short in the horizontal pnp transistor, to exhibit apparent effects.

In a first process for producing a semiconductor device equipped with a trimming circuit having a Zener zap diode, and comprising a diode between a terminal for applying a voltage used on trimming the trimming circuit and the Zener zap diode, the process comprises a step of forming a buried region of a first conductive type in a semiconductor substrate, a step of forming a semiconductor layer of the first conductive type on the buried region, a step of forming a first region of a second conductive type in the semiconductor layer, a step of forming a second region of the first conductive type in the semiconductor layer, a step of forming a third region of the first conductive type in the first region, and a step of forming an electrode on the first region, the second region and the third region, to commonly connect the electrode on the first region and the third region.

In the first process for producing a semiconductor device, a pn junction diode using a base-collector junction of an npn transistor is formed by connecting the emitter (the third region) and the base (the first region) with wiring (EB short) In the semiconductor device having such a structure formed, the collector electric current (Ic) is increased by operating the npn transistor in reverse (the emitter and the collector are operated in reverse), and thus the ratio of Ic with respect to the leakage electric current (Isub) leaking to the side of the p type substrate is increased. By the process, a semiconductor device can be produced, by which the leakage electric current (Isub) leaking to the side of the p type substrate can be decreased when the Ic is constant.

In the second process for producing a semiconductor device equipped with a trimming circuit having a Zener zap diode, and comprising a diode between a terminal for applying a voltage used on trimming the trimming circuit and the Zener zap diode, the process comprises a step of forming a buried region of a second conductive type in a semiconductor substrate, a step of forming a semiconductor layer of the second conductive type on the buried region, a step of forming a first region of a first conductive type and a fourth region of the first conductive type in the semiconductor layer, a step of forming a second region of the second conductive type on the semiconductor layer, a step of forming a third region of the second conductive type in the first region of the first conductive type, a step of forming an electrode on the first region and the third region, to commonly connect thereto, and a step of forming an electrode on the second region and the fourth region, to commonly connect thereto.

In the second process for producing a semiconductor device, an acceptor region (base 2) (the fourth region) is provided between the base (the first region) and the collector (the second region) of the npn transistor. The collector (the second region) and the base 2 (the fourth region) form a short circuit, and the emitter (the third region) and the base (the first region) form a short circuit, by forming wiring connecting them. By such a structure, the Isub (leakage of an electric current to the p type substrate) is suppressed owing to the synergistic effect of the first semiconductor device and the third semiconductor device described later.

In a third process for producing a semiconductor device equipped with a trimming circuit having a Zener zap diode, and comprising a diode between a terminal for applying a voltage used on trimming the trimming circuit and the Zener zap diode, the process comprises a step of forming a buried region of a second conductive type in a semiconductor substrate, a step of forming a semiconductor layer of the second conductive type on the buried region, a step of forming a first region of a first conductive type and a third region of the first conductive type in the semiconductor layer, a step of forming a second region of the second conductive type connected to the buried region, in the semiconductor layer, a step of forming an electrode on the second region and the third region, to commonly connect thereto, and a step of forming an electrode on the first region.

In the third process for producing a semiconductor device, the emitter (the third region) and the base (the first region) of the horizontal pnp transistor are connected by forming the wiring, and the collector (the second region) and the base (the first region) are connected by forming the wiring, so that they form short circuits, respectively. The Ic can be increased by operating the horizontal pnp transistor formed in this manner, and the ratio of Ic with respect to the leakage electric current (Isub) leaking to the side of the p type substrate can be increased. By the process, a semiconductor device can be produced, by which the leakage electric current (Isub) leaking to the side of the p type substrate can be decreased when the Ic is constant.

Accordingly, the electric current flowing in the diode is increased relative to the leakage electric current to the semiconductor substrate using the npn or pnp bipolar transistor of the invention, whereby the ratio of the leakage electric current to the diode electric current can be improved, it is produced without changing the normal process, and the resistance to latch up due to the leakage electric current can be improved.

DESCRIPTION OF PREFERRED EMBODIMENTS

Examples of Mode of carrying out the invention will be described below with reference to the drawings.

An embodiment of the first semiconductor device will be described with reference to FIGS. 4 to 6. A planer pn junction diode employing a base-collector junction of an npn bipolar transistor having the so-called washed polyemitter (single polysilicon) structure will be shown herein.

Figure 4:
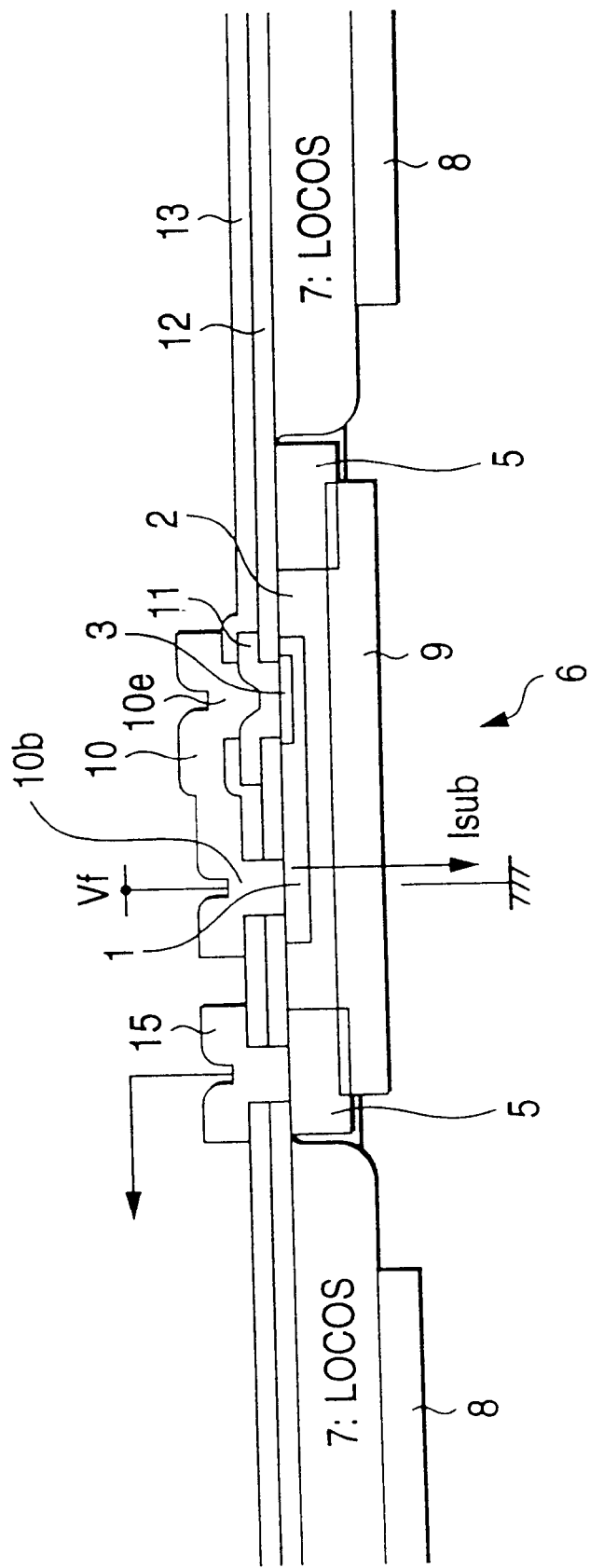
FIG. 4 is a schematic cross sectional view of a semiconductor device having a planar junction type diode using a vertical npn bipolar transistor according to an embodiment the invention.

In the semiconductor device having a junction type diode shown in FIG. 4, an n type high concentration collector buried region (N-BL; N-buried layer) 9 is constructed in a p type semiconductor substrate (P-sub) 6, and an ISO 8 called a channel stopper 8 is constructed in an outer periphery thereof by diffusion of a p type high concentration impurity in the vertical direction, so that the respective elements are physically or electrically isolated. The p type semiconductor substrate 6 may have a plan shape or other shapes, such as a spherical shape.

On an upper part of the ISO 8, the channel stopper 8 of a p type high concentration impurity region, an insulating layer (or an element isolation region LOCOS; local oxidation of silicon) 7 constructed with a silicon oxide film is constructed. Elements, such as a transistor, are formed in a region surrounded by the LOCOS 7. On an upper part of the n type high concentration collector buried region 9, an n type epitaxial layer (N-epi layer) 2 is constructed, which is formed by epitaxial growth.

A p type intrinsic base region (sometimes simply referred to as a base region) 1 is constructed in the n type epitaxial layer 2. An n type high concentration emitter region 3 is constructed by diffusion of an n type impurity in the intrinsic base region 1.

Next, on both ends of the collector buried region 9 to the surface of the n type epitaxial layer 2, an $N^+$ sinker (PLG; plug) 5 of a high concentration n type impurity is constructed, to reduce the collector resistance.

Furthermore, insulating films 12 and 13 of $SiO_2$ or the like are accumulated over the whole surface of the p type semiconductor substrate, with openings over the emitter region 3, the base region 1 and the $N^+$ sinker 5 respectively. Among the openings, a polysilicon film 11 is formed only over the emitter region 3, to construct a part of the emitter electrode.

On an upper part of the $N^+$ sinker 5 for withdrawing the collector electrode, a metallic electrode film of Al is accumulated to construct a collector metallic electrode film (sometimes referred to as a collector electrode) 15, a base metallic electrode film 10b (sometimes referred to as an electrode 10) and an emitter metallic electrode film 10e (sometimes referred to as an electrode 10) of Al that is the same as the collector electrode 15 are simultaneously accumulated and connected thereto. An interlevel insulating film, an upper layer wiring layer are formed on an upper part of the metallic electrode films, to construct an integrated circuit.

As described in the foregoing, in the vertical npn bipolar transistor, the emitter electrode 10e and the base electrode 10b are commonly connected, to which a constant bias voltage Vf is applied, and the collector electrode 15 is connected to a circuit, so as to construct diodes using the base (emitter) electrode 10b (10e) and the collector electrode (15).

Figure 5:
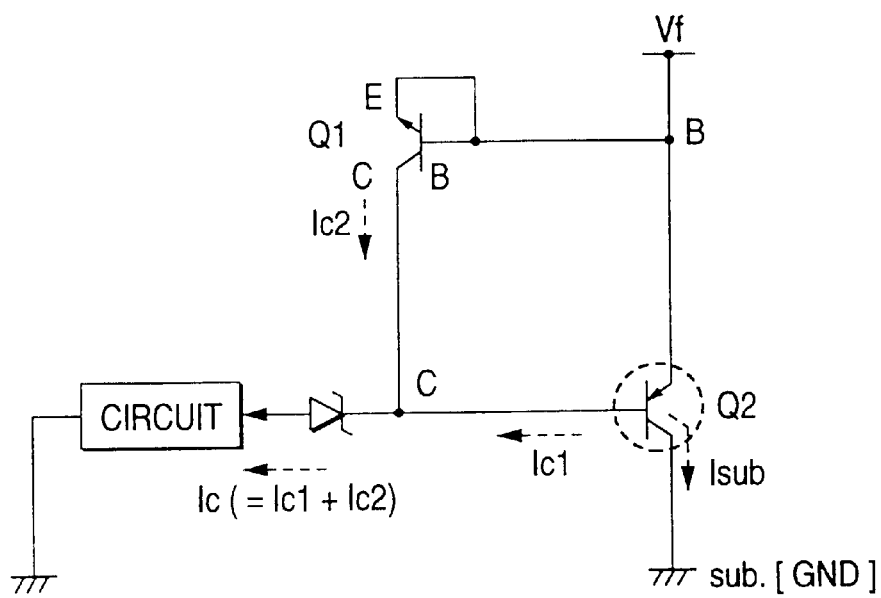
FIG. 5 is a circuit diagram showing an equivalent circuit of the planar junction type diode using the vertical npn bipolar transistor according to the embodiment the invention shown in FIG. 4.

Next, a specific example of the equivalent circuit of the diode constructed by the structure is shown in FIG. 5.

The emitter region 3, the base region 1 and the collector region 15 constructing the vertical npn bipolar transistor shown in FIG. 4 are expressed by a transistor Q1 in FIG. 5, and a constitution, in which the base electrode 10b and the emitter electrode 10e form a short circuit, is formed to construct a diode.

Furthermore, a parasitic pnp bipolar transistor Q2 constructed by the base region 1, the collector buried region (N-BL) 9 and the P-sub 6 in FIG. 4 is equivalently connected in parallel to the vertical npn bipolar transistor Q1.

Figure 6:
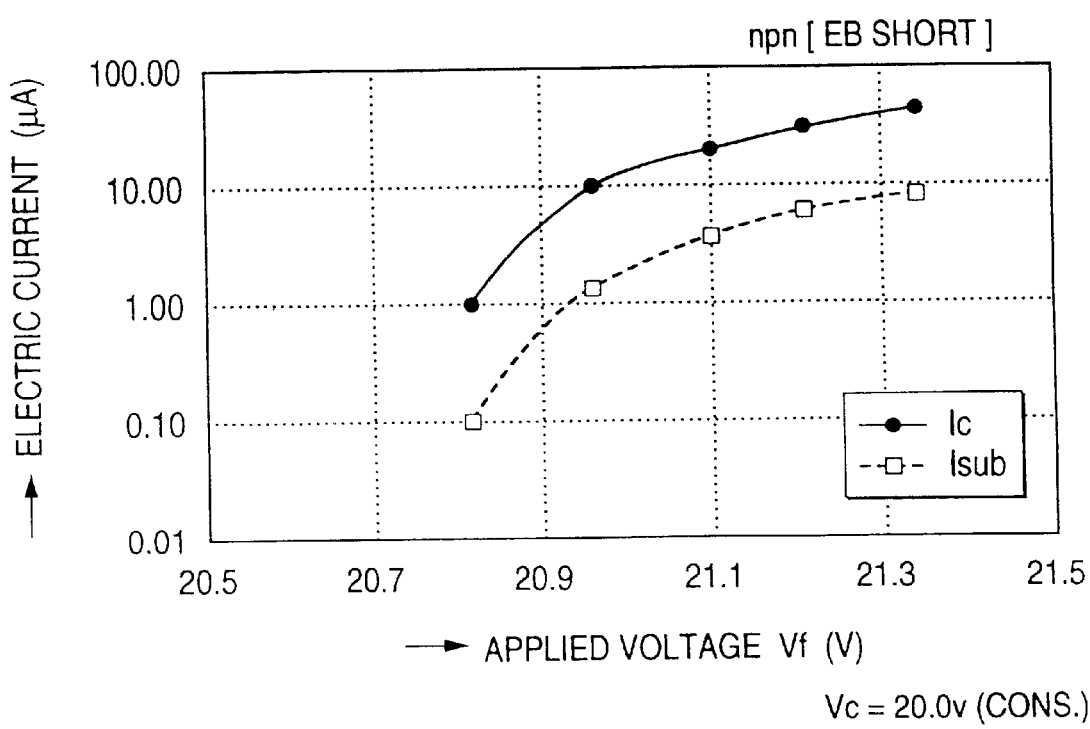
FIG. 6 is a graph showing the electric current of the diode and the leakage electric current of the planar junction type diode using the vertical npn bipolar transistor according to the embodiment the invention shown in FIG. 4.

In the case where an applied voltage Vf is supplied to the planar junction type diode constructed by commonly connecting the base electrode 10b and the emitter electrode 10e of the vertical npn bipolar transistor Q1 in order to reduce the influence of the parasitic pnp bipolar transistor Q2, the characteristics of the diode (operation) electric current and the leakage current with respect to the change of the applied voltage Vf are shown in FIG. 6.

In FIG. 6, the ordinate indicates the electric current Ic flowing in the collector electrode (cathode) 15 and the leakage electric current Isub flowing in the P-sub 6, which is graduated in a logarithmic scale in the range of from 0.01 $\mu A$ to 100 $\mu A$, and the abscissa is the applied voltage supplied to the base electrode (anode) 10b (sometimes referred to as a bias voltage) Vf, which is graduated from 20.5 V to 21.5 V by a step of 0.2 V.

As shown in FIG. 6, when the applied voltage Vf is 20.8 V, the collector electric current Ic is about 1.0 $\mu A$, and the leakage electric current Isub is 0.1 $\mu A$, i.e., the leakage electric current is smaller by one digit. When the applied voltage Vf becomes 21.1 V, Ic is 30 $\mu A$, and Isub is 4 $\mu A$, i.e., Isub is smaller. Furthermore, when the applied voltage Vf becomes 21.3 V, Ic is 50 $\mu A$, and Isub is 8 $\mu A$, i.e., the leakage electric current is smaller, to make the ratio of Isub and Ic of from $1/7$ to $1/10$, so that the leakage electric current is reduced relative to the conventional example shown in FIG. 1.

In the semiconductor device shown in FIG. 4, in order to suppress the leakage electric current (Isub) to the substrate 6, the $N^+$ sinker (PLG; plug) 5 as an impurity concentration region of the collector electrode has such a shape that surrounding the whole element (i.e., the collector ring structure), and the whole element are electrically isolated from the substrate 6 along with the N-BL 9. Furthermore, the base region 1 and the emitter region 3 are connected with the wiring 10, and a higher potential is applied to the emitter electrode 10e than that of the collector electrode 15, so that the electric current (Ic2) formed by operating the npn transistor itself in a reverse direction in addition to the electric current (Ic1) in the normal direction of the diode. That is, Ic is the sum of Ic1 and Ic2. According to the constitution, when the potential difference between the base region 1 and the collector region 2 is constant, the electric current value becomes large in comparison to the case where the emitter region 3 is opened, and when the collector electric current value (Ic) in this embodiment and the conventional embodiment are the same value, the leakage electric current (Isub) can be relatively decreased.

Figure 7:
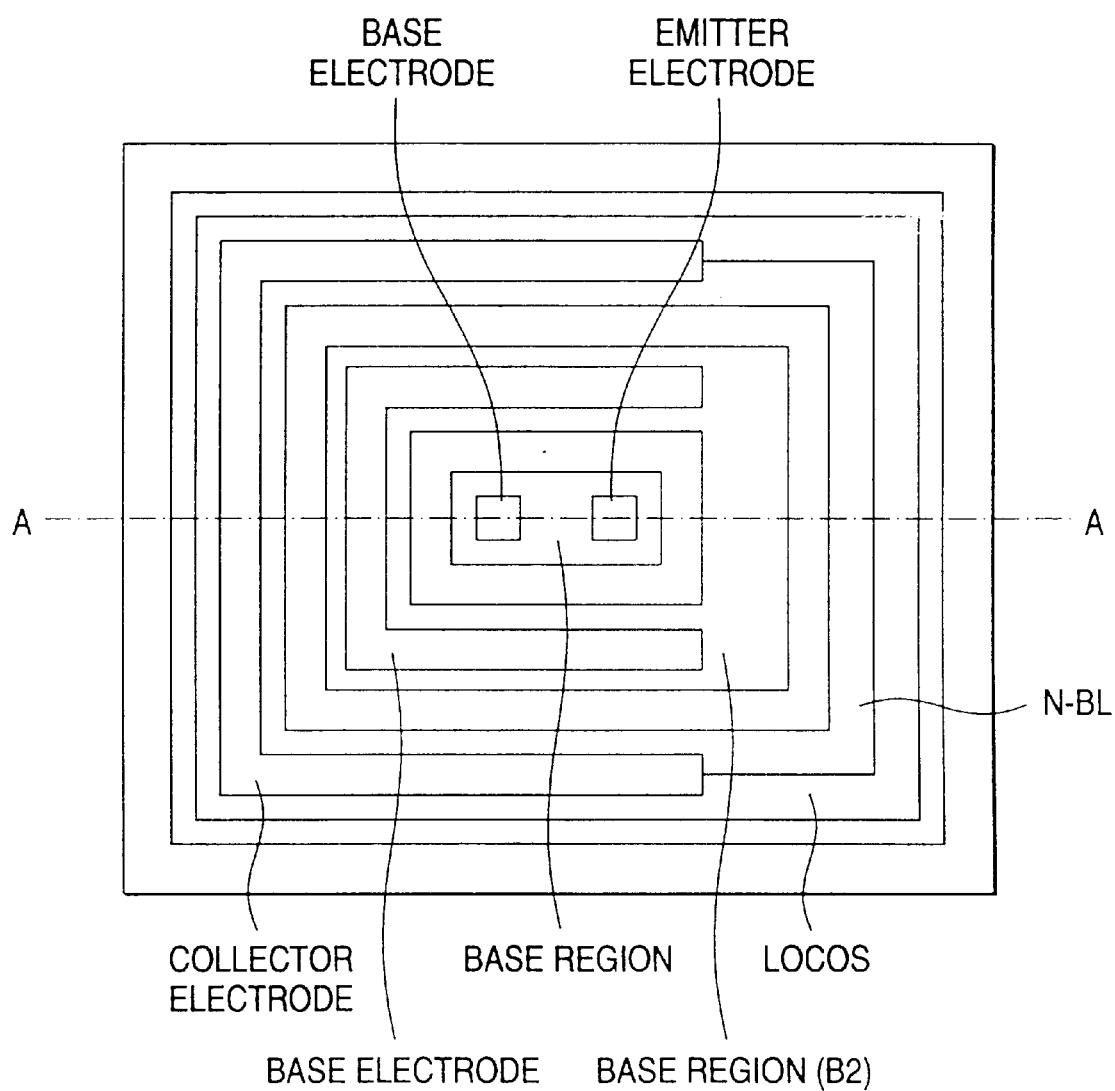
FIG. 7 is a pattern diagram of the semiconductor device having the planar junction type diode using the vertical npn bipolar transistor according to an embodiment of the invention.

An embodiment of the second semiconductor device will be described with reference to FIGS. 7 to 9. A planer pn junction diode employing a base-collector junction of an npn bipolar transistor having the so-called washed polyemitter (single polysilicon) will be shown herein. A pattern of a planar junction type diode using a vertical npn bipolar transistor is shown in FIG. 7, and FIG. 8 shows a cross sectional structure on line A—A in FIG. 7.

Figure 8:
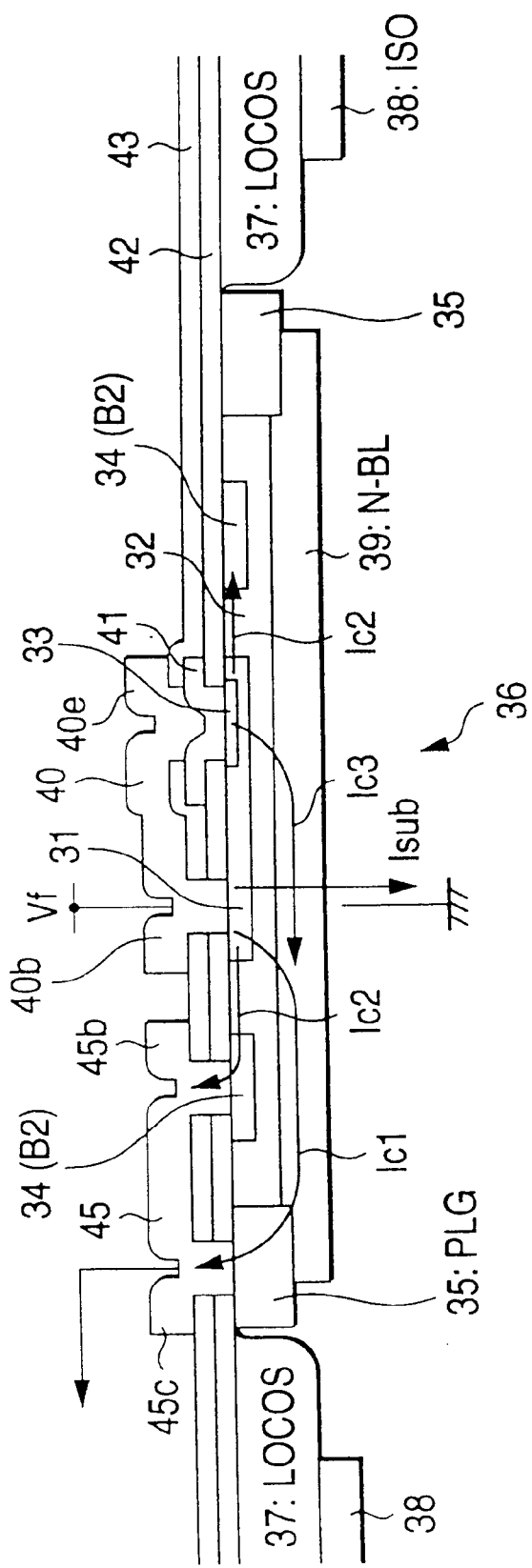
FIG. 8 is a schematic cross sectional view of the semiconductor device having the planar junction type diode using a vertical npn bipolar transistor according to the embodiment of the invention shown in FIG. 7.

In the semiconductor device of the planar junction type diode shown in FIG. 8, an n type high concentration collector buried region (N-BL; N-buried layer) 39 is constructed in a p type semiconductor substrate (36), an ISO 38 called a channel stopper 38 is constructed in an outer periphery thereof by diffusion of a p type high concentration impurity in the vertical direction, so that the respective elements are physically or electrically isolated by the ISO the channel stopper 38.

An insulating layer 37 (or an element isolation region, LOCOS; local oxidation of silicon) constructed by a silicon oxide film is constructed on an upper part of the ISO 38, the channel stopper of a p type high concentration impurity region. Elements, such as a transistor, are formed in a region surrounded by the LOCOS insulating layer 37. ON an upper part of the n type high concentration collector buried region 39, an n type epitaxial layer (N-epi layer) 32 is constructed, which is formed by epitaxial growth.

In the n type epitaxial layer 32, a p type first intrinsic base region (sometimes simply referred to as a base region) 31 and a second intrinsic base region (sometimes simply referred to as a base region) (B2) 34 constructed to surround the first intrinsic base region 31 are constructed.

Therefore, in the cross sectional structure shown in FIG. 8, the second intrinsic base region (B2) 34 is constructed on both ends of the first intrinsic base region 31. An emitter region 33 formed in the first intrinsic base region 31.

On both ends of the collector buried region 39 to the surface of the n type epitaxial layer 32, an N+ sinker (PLG; plug) 35 of a high concentration n type impurity is constructed, to reduce the collector resistance.

Furthermore, insulating films 42 and 43 of $SiO_2$ or the like are accumulated over the whole surface of the p type semiconductor substrate 36. In the insulating films 42 and 43, there exist openings over the emitter region 33, the base regions 31 and 34, and the collector region, respectively. Among the openings, a polysilicon film 41 is formed on the emitter region 33, to construct a part of the emitter electrode (40).

On an upper part of the N+ sinker 35 for withdrawing the collector electrode, a collector electrode 45c formed by accumulating a metallic electrode film of Al is commonly connected to a base electrode 45b accumulated on the second intrinsic base region B2 (34), and metallic films of a base electrode 40b and an emitter electrode 40e on the first intrinsic base region (31) formed by accumulating a metallic electrode film of Al that is the same as the collector electrode 45c are simultaneously accumulated and connected thereto. An interlevel insulating film, an upper layer wiring layer are formed on an upper part of the metallic electrode films, to construct an integrated circuit.

As described in the foregoing, the second intrinsic base region (B2) 34 is constructed to surround the first intrinsic base region 31 of the vertical npn bipolar transistor. While the emitter electrode 40e on the emitter region 33 and the base electrode 40b formed on the first intrinsic base region 31 are connected to each other, a constant applied voltage (or a bias voltage) Vf is supplied to the base (or emitter) electrode 40b (40e), and the collector electrode 45c and the base electrode 45b on the second intrinsic base region (B2) 34 are commonly connected and connected to an outer circuit, so as to realize a planar junction type diode.

Figure 9:
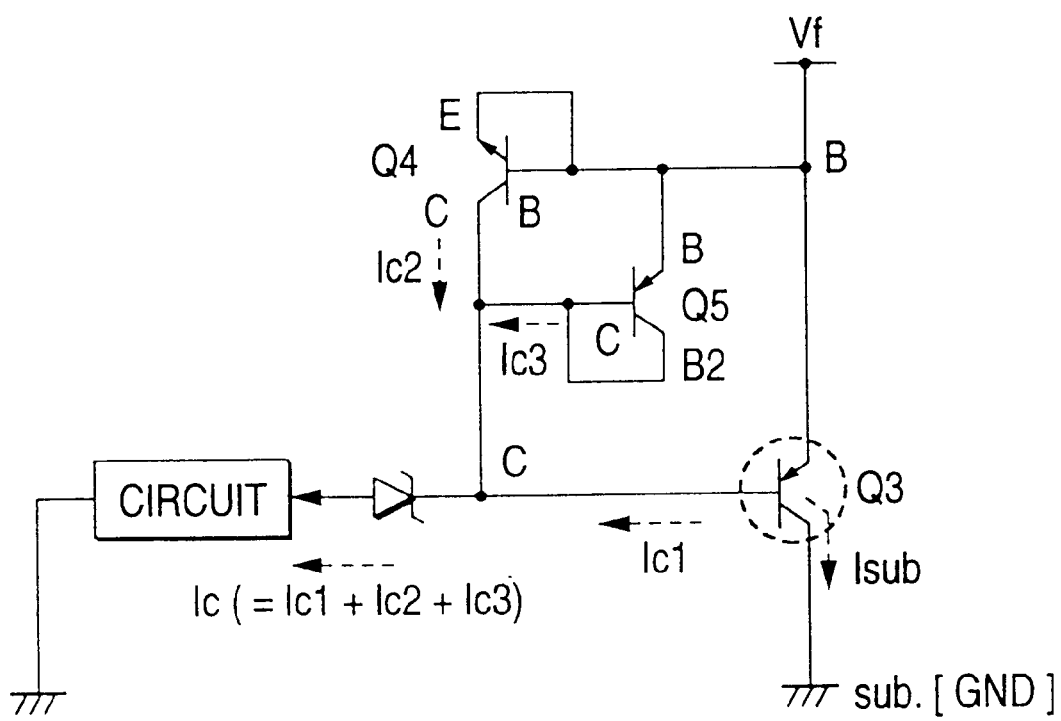
FIG. 9 is a circuit diagram showing an equivalent circuit of the planar junction type diode using the vertical npn bipolar transistor according to the embodiment of the invention shown in FIG. 8.

A specific example of the equivalent circuit of the diode constructed by the structure shown in FIGS. 7 and 8 is shown in FIG. 9.

The emitter region 33, the base region 31 and the N+ sinker 35 of the collector region constructing the vertical npn bipolar transistor shown in FIG. 8 are expressed by a transistor Q4 in FIG. 6, and a constitution, in which the base electrode and the emitter electrode form a short circuit, is formed to construct a diode. Furthermore, a parasitic pnp bipolar transistor constructed by the base region 31, the N-BL 39 constituting a part of the collector region, and the P-sub 36 is expressed by Q3.

A pnp bipolar transistor constructed by the first intrinsic base region 31, the N-BL 39 and the second intrinsic base region (B2) 34 is expressed by Q5, and the diodes Q4 and Q5 are connected in parallel, to form a circuit constitution, in which they are connected between the emitter electrode and the base electrode of the parasitic pnp bipolar transistor Q3.

The electric current Ic3 introduced from the diode constructed by the npn transistor Q4 and the electric current Ic2 introduced from the diode constructed by the pnp transistor Q5 are increased by adding to the electric current Ic1 of the parasitic pnp bipolar transistor Q3, but Isub is constant. Therefore, the leakage electric current Isub is constant with respect to the total electric current flowing in the three diodes Q3, Q4 and Q5, Ic1+Ic2+Ic3 (=Ic), and the ratio of Isub/Ic is further decreased in comparison to the case of FIG. 4.

In the semiconductor device described in FIGS. 7 to 9, in order to suppress the leakage electric current (Ic) to the substrate, the N+ sinker (PLG; plug) 35 as an impurity concentration region of the collector electrode has such a shape that surrounds the whole element (i.e., the collector ring structure), and also has such a shape that electrically separates the whole element from the substrate along with the N-BL 39.

By connecting the first base region 31 and the emitter region 33 with the wiring 40, making the electric potential of the emitter electrode higher than that of the collector electrode, in addition to the electric (Ic1) in the normal direction, the electric current (Ic2) flows by operating the npn transistor itself in the reverse direction. Furthermore, because the second base region 34 is provided to surround the base region 31, and the second base region 34 and the plug region 35 are connected with the wiring 45, the electric current Ic3 flows by operating the base region 31 and the second base region 34 as the horizontal pnp transistor in addition to the electric current (Ic1) in the normal direction of the normal diode. That is, Ic is the sum of Ic1, Ic2 and Ic3.

Accordingly, when the potential difference between the first base region 31 and the collector electrode 45c is constant, the electric current value becomes large in comparison to the case where the second base region 34 is not present, and when the collector electric value (Ic) is the same in this embodiment and the conventional embodiment, the leakage electric current (Isub) to the substrate becomes relatively small in comparison to the conventional embodiment.

The first process for producing a semiconductor device having a planar junction type diode using a vertical npn bipolar transistor will then be show in FIG. 10A to FIG. 10C and FIG. 11D to FIG. 11F. In this embodiment, a process for producing a semiconductor device having a planer junction type diode using a vertical npn bipolar transistor.

Figure 10A:
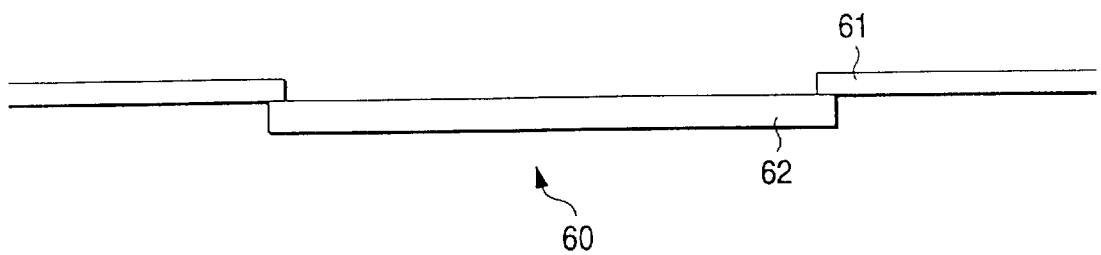
FIGS. 10A–10C is a schematic cross sectional view showing a process for producing a semiconductor device having a planar junction type diode using a vertical npn bipolar transistor according to an embodiment of the invention.

As shown in FIG. 10A, a silicon oxide film ($SiO_2$ film) 61 having a film thickness of 330 nm is formed by a thermal oxidation method on a p type semiconductor substrate (P-sub) 60. The silicon oxide film 61 is etched and removed by using a resist pattern (not shown in the figure) formed by a lithography method as a mask, to open an element region of a transistor. The resist is then removed.

A high concentration collector buried layer (N-BL) 62 having antimony Sb as an impurity is formed on a primary surface of the p type semiconductor substrate 60 in the opening of the element region by gas phase diffusion (1,200° C., 1 hour) using antimony oxide ($Sb_2O_3$) as a solid diffusion source not shown in the figure. The sheet resistance of the high concentration collector buried layer 62 is from 20 to 50 Ω per square, and the depth is about from 1 to 2 μm.

Figure 10B:
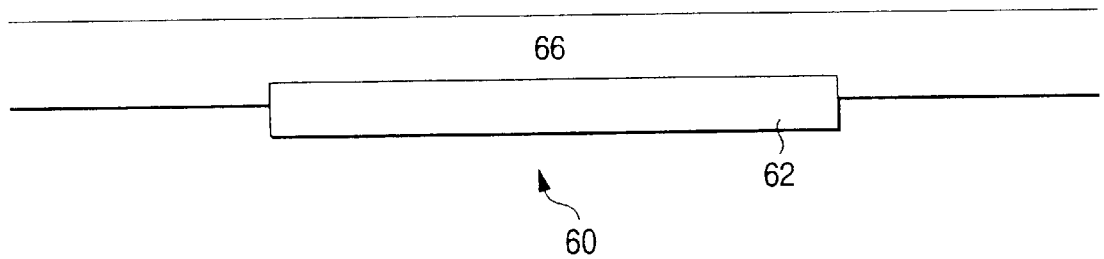

After removing the silicon oxide film 61 by wet etching using hydrofluoric acid, an n type epitaxial layer (N-epi layer) 66 having a resistivity of about from 0.3 to 5.0 Ωcm is accumulated on the p type semiconductor substrate (60) to a film thickness, for example, of from 0.7 to 2.0 μm by the known epitaxial technique as shown in FIG. 10B.

Figure 10C:
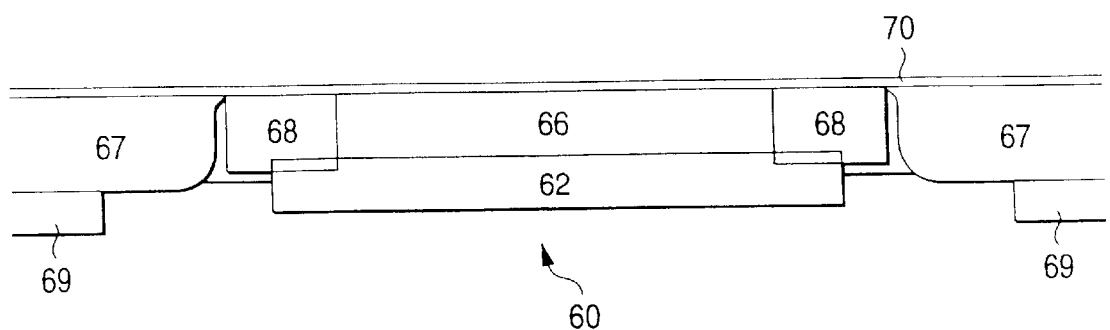

Subsequently, as shown in FIG. 10C, after accumulating a silicon oxide film to a film thickness of about 50 nm on the surface of the p type semiconductor substrate 60, a silicon nitride film (not shown in the figure) is formed to a film thickness of 100 nm on the silicon oxide film by a CVD method. The silicon oxide film described above is used as a buffer film upon conducting a LOCOS method, and the silicon nitride film is used as a mask upon conducting a LOCOS method. The film thickness of the silicon oxide film and the silicon nitride film is determined by the length of the bird's beak of element isolation formed by the LOCOS method, and the range where the formation of stress and crystal defects associated with the LOCOS method can be prevented.

A photoresist film is accumulated on the silicon nitride film, and subjected to pattern working to open the part of an element isolation region. The silicon nitride film, the silicon oxide film and the surface of the p type semiconductor substrate 60 are then etched one by one using the photoresist pattern. The etching amount of the p type semiconductor substrate is about ½ of the film thickness of the element isolation film, so that the surface of the p type semiconductor substrate after forming the element isolation film by a LOCOS method becomes flat.

Thereafter, the photoresist (pattern) is removed, and an element isolation film (LOCOS) 67 is formed. The element isolation film 67 is formed with silicon oxide on the front surface, i.e., the surface, on which the element is formed, of the p type semiconductor substrate 60 by, for example, steam oxidation at 1,000 to 1,050° C. The film thickness of the element isolation film 67 is, for example, from 0.8 to 1.5 μm. The silicon nitride film is then removed by wet etching using hot phosphoric acid.

A photoresist film not shown in the figure is coated, in which a window for forming an N$^+$ sinker 68 is opened, and by using it as a mask, ion implantation is conducted under the conditions of an ion implantation energy of from 40 to 400 kev and a dose amount of $1 \times 10^{15}$ atoms/cm$^2$, to form the N$^+$ sinker 68.

The photoresist is then the removed, a silicon oxide film is accumulated to a film thickness of about from 100 to 600 nm by a CVD method, and a photoresist film is coated on the upper surface thereof. Then, etching is conducted from the upper surface of the photoresist film by an RIE method until the surface of the p type semiconductor substrate 60 becomes flat. After flattening, a silicon oxide film having a film thickness of about from 10 to 30 nm is formed by a thermal oxidation method, and a photoresist is coated, in which a region for forming a channel stopper 69 is opened on the substantially central part of the element isolation film 67 on the p type semiconductor substrate 60.

A p type impurity is ion-implanted by using the photoresist as a mask to form a channel stopper (ISO) 69 under the element isolation film 67. The conditions for the ion implantation are, for example, an ion implantation energy of a boron ion B$^+$ of from 200 to 500 kev and a dose amount of from $1 \times 10^{13}$ to $1 \times 10^{14}$ atoms/cm$^2$. Subsequently, a silicon oxide film 70 is accumulated to 50 to 200 nm by a CVD method.

Figure 11D:
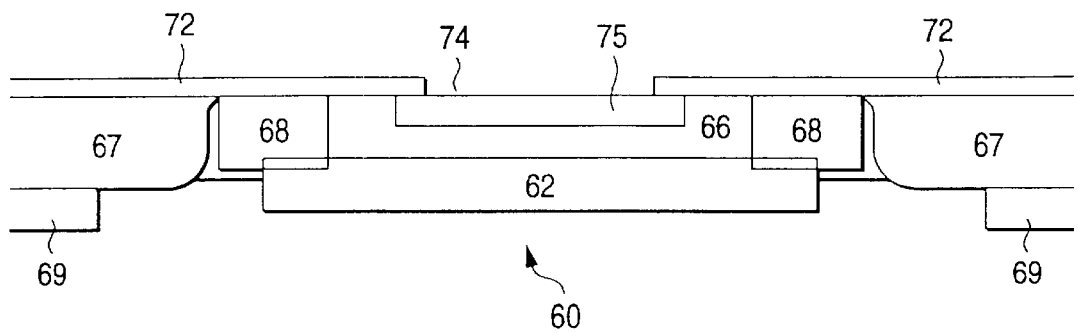
FIGS. 11D–11F is a schematic cross sectional view showing a process for producing a semiconductor device having a planar junction type diode using a vertical npn bipolar transistor according to an embodiment of the invention.

As shown in FIG. 11D, an insulating film 72 of a silicon oxide SiO$_2$ film is further accumulated to 200 to 500 nm by a CVD method (which may be omitted depending on cases), and after opening in an active region using a photoresist as a mask, etching is conducted until the n type epitaxial layer 66 is exposed to form an opening 74. A p type impurity is ion-implanted in the opening 74 to form a base region 75. The conditions of the ion implantation are, for example, in the case where the impurity ion is B$^+$, an ion implantation energy of from 5 to 100 kev and a dose amount of about from $5.0 \times 10^{11}$ to $5.0 \times 10^{14}$ atoms/cm$^2$, and in the case of an BF$_2^+$ ion, an ion implantation energy of from 5 to 200 kev and a dose amount of about from $5.0 \times 10^{11}$ to $5.0 \times 10^{14}$ atoms/cm$^2$.

Figure 11E:
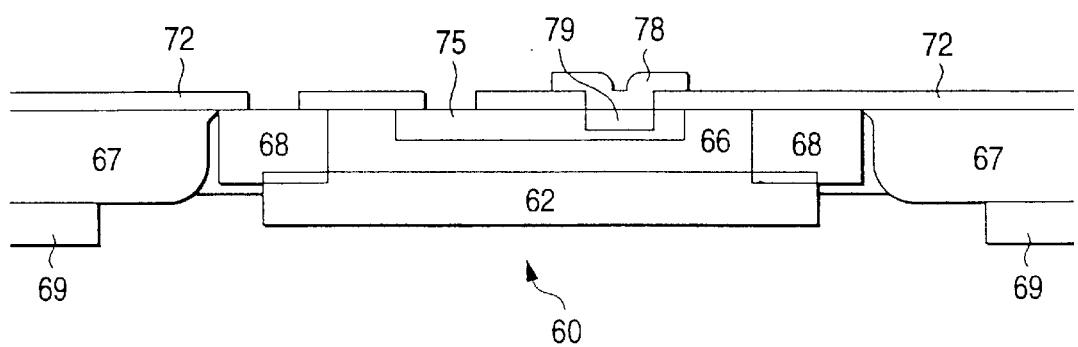

Subsequently, as shown in FIG. 11E, an N$^+$ poly-Si layer 78 containing an n type impurity is accumulated on the whole surface, which can be formed by attaching and forming an N$^+$ poly-Si layer containing an n type impurity, or by a manner in that after forming a poly-Si layer containing no impurity, an n type impurity, such as arsenic As and phosphorous P, is ion-implanted. In the case of an As ion, the ion implantation energy is from 30 to 100 kev, and the dose amount is from $1 \times 10^{15}$ to $1 \times 10^{16}$ atoms/cm$^2$.

SiO$_2$ is then accumulated to 100 to 500 nm by a CVD method, and a heat treatment at about from 700 to 1,200° C. is conducted for 5 seconds to 2 hours, whereby the n type impurity is diffused from the N$^+$ poly-Si layer 78 to the (intrinsic) base region 75, to form an emitter region 79. Subsequently, the N$^+$ poly-Silayer 78 is worked by using photolithography and an RIE method, and the other part than the emitter region (79) of the vertical npn bipolar transistor is removed.

Figure 11F:
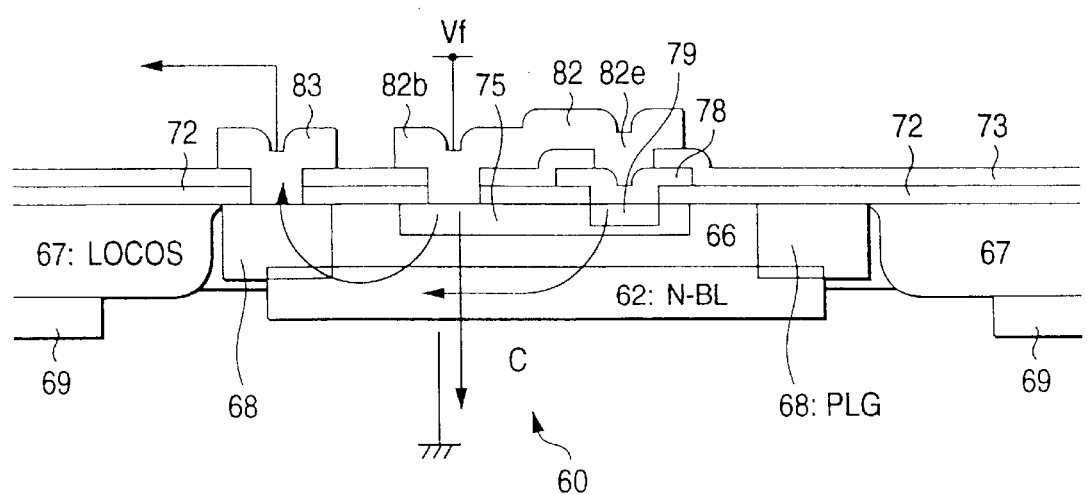

As shown in FIG. 11F, openings for a collector electrode 83 and a base electrode 82b of the vertical npn bipolar transistor are formed, and a barrier metal and an Al alloy are accumulated by a sputtering method, which is then worked by a photoresist technique and an RIE method, to form an emitter electrode 82e, a base electrode 82b and a collector electrode 83.

In this stage, it is characteristic that in order to form the planar junction type diode using the vertical npn bipolar transistor, a pattern, in which the emitter electrode 82e and the base electrode 82b are commonly connected, is used.

Figure 1:
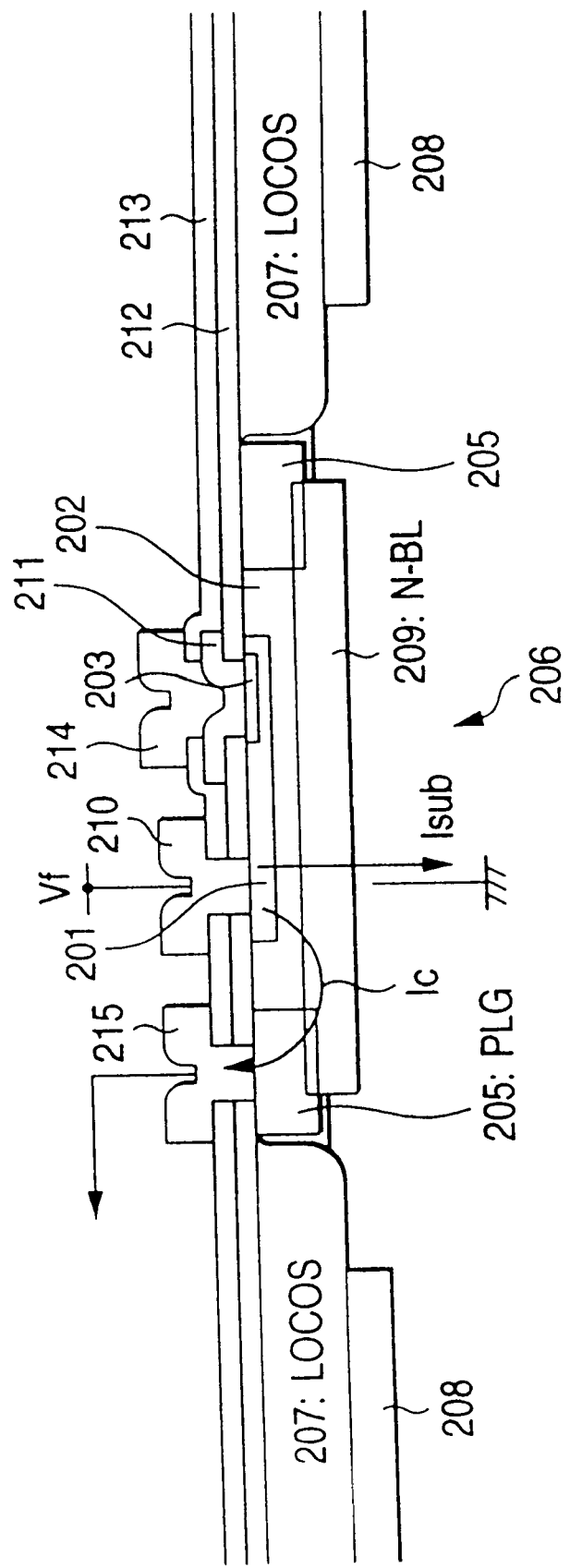
FIG. 1 is a schematic cross sectional view of a semiconductor device having a planar junction type diode using a vertical npn bipolar transistor according to the conventional example.
Figure 2:
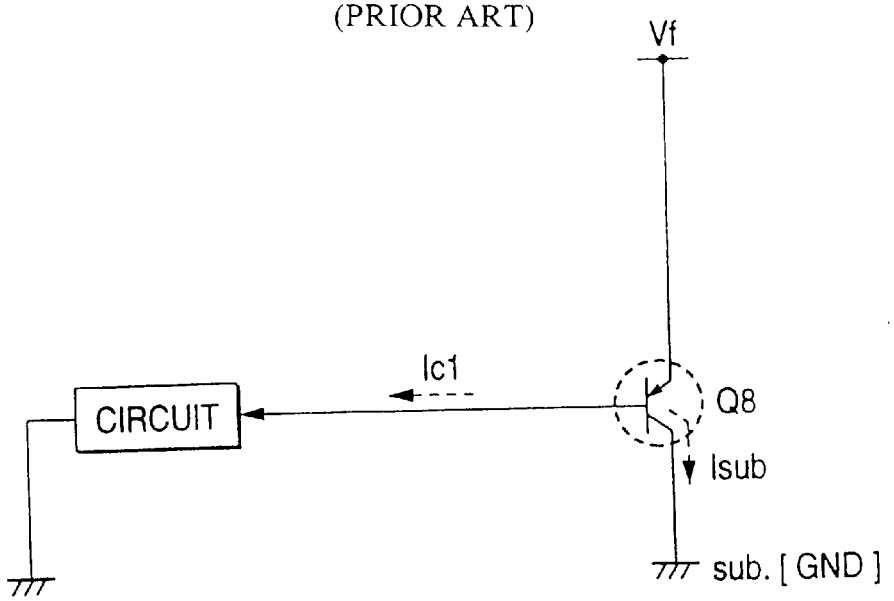
FIG. 2 is a circuit diagram showing an equivalent circuit of the planar junction type diode using the vertical npn bipolar transistor according to the conventional example shown in FIG. 1.

As described in the foregoing, the planar junction type diode using the vertical npn bipolar transistor has such a constitution that the base electrode and the emitter electrode are connected, to which common electrode an applied voltage Vf is supplied, and the collector corresponding to a cathode is connected to an outer circuit owing to the constitution, the electric current amount of the electric current flowing in the planar junction type diode is larger than the leakage electric current flowing in the parasitic pnp bipolar transistor, the ratio of leakage electric current to diode electric current is smaller than the conventional planar junction type diode shown in FIGS. 1 and 2, so that the characteristics are relatively improved.

An embodiment of the second process for producing a semiconductor device will be described with reference to FIGS. 10A to 10C and FIGS. 11D to 11F.

This embodiment is that, in the process for producing a vertical npn bipolar transistor shown in FIGS. 10A to 10C and FIGS. 11D to 11F, the p type impurity diffusion region of the base region 75 in FIG. 11D is particularly formed in two positions in the n type epitaxial layer (66). For the numbers of the respective components herein are used, the same numbers as in Example 3 of mode of carrying out, and explanation is made with reference to the same drawings.

Specifically, FIG. 10A to FIG. 10C are the same as the previous example. In the production process of FIG. 11D, an insulating film 72 of a silicon oxide $SiO_2$ film is firstly accumulated to 200 to 500 nm by a CVD method, two openings are formed in an active region by using a photoresist as a mask, and etching is conducted until the n type epitaxial layer 66 is exposed to form respective openings 74 and 74a (not shown in the figure). The opening 74a may be simply formed on the side of the opening 74.

A p type impurity is ion-implanted to the respective openings 74 and 74a, to form base regions 75 and 75a (not shown in the figure). For example, the conditions for the ion implantation are, in the case where the impurity ion is $B^+$, an ion implantation energy of from 5 to 100 kev, and a dose amount of about from $5.0\times10^{11}$ to $5.0\times10^{14}$ atoms/cm$^2$, and in the case of a $BF_2$+ion, an ion implantation energy of from 5 to 200 kev, and a dose amount of about from $5.0\times10^{11}$ to $5.0\times10^{14}$ atoms/cm$^2$. The base region 75a herein may be formed simply in the opening 74a.

Subsequently, as similar to FIG. 11E, an $N^+$ poly-Si layer 78 containing an n type impurity is accumulated in the opening 74 positioned at the central part among the openings in the base region, which can be formed by attaching and forming an $N^+$ poly-Si layer 78 containing an n type impurity, or by a manner in that after attaching and forming a poly-Si layer (78) containing no impurity, an n type impurity, such as arsenic As and phosphorous P, is ion-implanted. In the case of an As ion, the ion implantation energy is from 30 to 100 kev, and the dose amount is from $1\times10^{15}$ to $1\times10^{16}$ atoms/cm$^2$.

$SiO_2$ is then accumulated to 100 to 500 nm by a CVD method, and a heat treatment at about from 700 to 1,200° C. is conducted for 5 seconds to 2 hours, whereby the n type impurity is diffused from the $N^+$ poly-Si layer 78 to the base region 75, to form an emitter region 79. At this time, the formation of the emitter region is effected only for the base region 75, but is not effected for the other base region 75a. Subsequently, the $N^+$ poly-Si layer 78 is worked by using photolithography and an RIE method, and the other part than the emitter region (79) of the vertical npn bipolar transistor is removed.

Thereafter, as similar to FIG. 11F, openings for a collector electrode 83 and a base electrode 82b of the vertical npn bipolar transistor are formed, and a barrier metal and an Al alloy are accumulated by a sputtering method, which is then worked by a photoresist technique and an RIE method, to form an emitter electrode 82e, base electrodes 82b and 82$b_1$ and a collector electrode 83 of the vertical NPN bipolar transistor. The base electrode 82$b_1$ is not shown in the figure because it is only formed simply on the side of the base electrode 82b.

In this stage, in order to form the planar junction type diode, a pattern, in which the emitter electrode 82e and the base electrode 82b are commonly connected, is used, and a pattern, in which the (second) base electrode (82$b_1$) and the collector electrode 83 are commonly connected, is also used.

Figure 12:
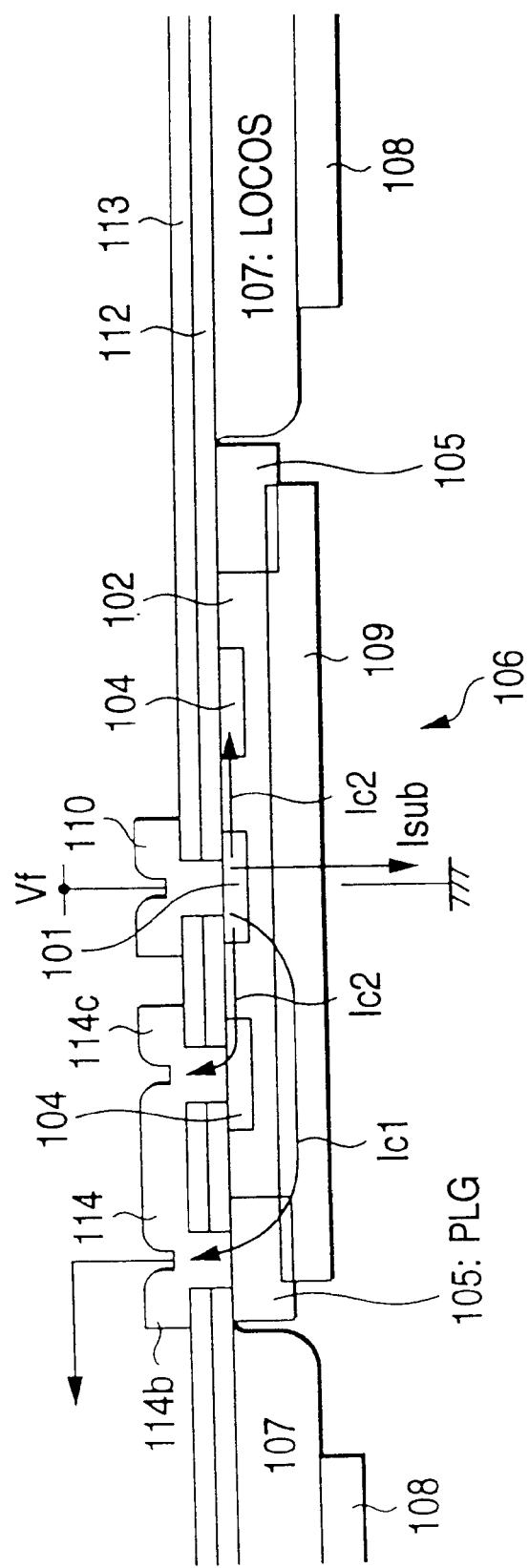
FIG. 12 is a schematic cross sectional view of a semiconductor device having a planar junction type diode using a horizontal pnp bipolar transistor according to a mode of carrying out the invention.

An embodiment of the third process for producing a semiconductor device will be described with reference to FIGS. 12 to 14. FIG. 12 shows a semiconductor device having a junction type diode using a horizontal pnp bipolar transistor.

In the semiconductor device having a planar junction type diode shown in FIG. 12, an n type high concentration collector buried region (N-BL; N-buried layer) 109 is constructed in a p type semiconductor substrate (P-sub) 106, and an ISO 108 called a channel stopper is constructed in an outer periphery thereof by diffusion of a p type high concentration impurity in the vertical direction, so that the respective elements are physically or electrically isolated.

On an upper part of the ISO 108, the channel stopper of a p type high concentration impurity region, an insulating layer (or an element isolation region LOCOS; local oxidation of silicon) 107 constructed with a silicon oxide film is constructed. Elements, such as a transistor, are formed in a region surrounded by the LOCOS 107. On an upper part of the n type high concentration base buried region 109, an n type epitaxial layer (N-epi layer) 102 is constructed, which is formed by epitaxial growth.

In the n type epitaxial layer 102, a p type emitter region 101 is constructed, and a collector region 104 is constructed on the both ends thereof.

On both ends of the base buried region 109 to the surface of the n type epitaxial layer 102, an $N^+$ sinker (PLG; plug) 105 of a high concentration of n type impurity is constructed, to reduce the base resistance.

Furthermore, insulating films 112 and 113 of $SiO_2$ or the like are accumulated over the whole surface of the p type semiconductor substrate, with openings over the emitter region 101, the collector region 104 and the $N^+$ sinker 105 constructing a part of the base region, respectively.

On an upper part of the $N^+$ sinker 105 for withdrawing the base electrode, a metallic electrode film of Al is accumulate to construct a base electrode 114b to commonly connect to the collector electrode 114c, and the emitter electrode 110 is constructed by a metallic electrode film of the same Al. An interlevel insulating film and an upper layer wiring layer are formed on an upper part of the metallic electrode films, to construct an integrated circuit.

As described with reference to FIG. 12, in the horizontal pnp bipolar transistor, a constant applied voltage (bias voltage) Vf is applied to the emitter electrode 110, and the collector electrode 114c and the base electrode 114b are commonly connected and connected to an outer circuit, so as to realize a planar junction type diode. A parasitic pnp bipolar transistor is constructed by the emitter region 101, the N-epi layer 102, the base buried region 109 and the p type semiconductor substrate 106.

Figure 13:
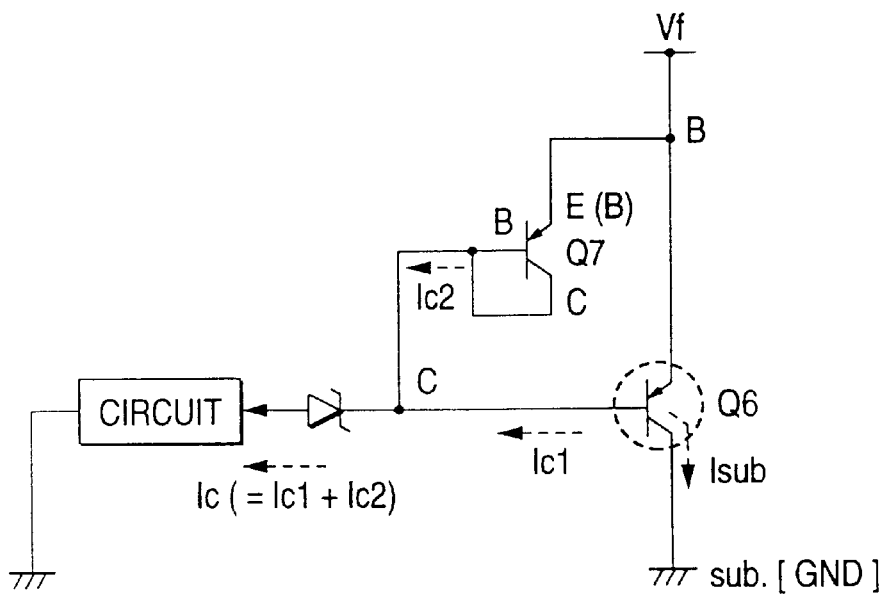
FIG. 13 is a circuit diagram showing an equivalent circuit of the planar junction type diode using the horizontal pnp bipolar transistor according to the embodiment of the invention shown in FIG. 12.

A specific example of the equivalent circuit of the diode constructed by the structure described with reference to FIG. 12 is shown in FIG. 13.

The emitter region 101, the $N^+$ sinker 105 as a part of the base region and the collector region 104 constructing the horizontal pnp bipolar transistor shown in FIG. 12 are expressed by a transistor Q7 in FIG. 13, and a constitution, in which the base electrode 114b and the collector electrode 114c form a short circuit, is formed to construct a diode. Furthermore, a parasitic pnp bipolar transistor Q6 constructed by the emitter region 101, the N-epi layer 102, the N-BL 109, and the collector of the p type semiconductor substrate 106 in FIG. 12 is equivalently connected in parallel to the horizontal pnp bipolar transistor Q7 as shown in FIG. 13.

Figure 14:
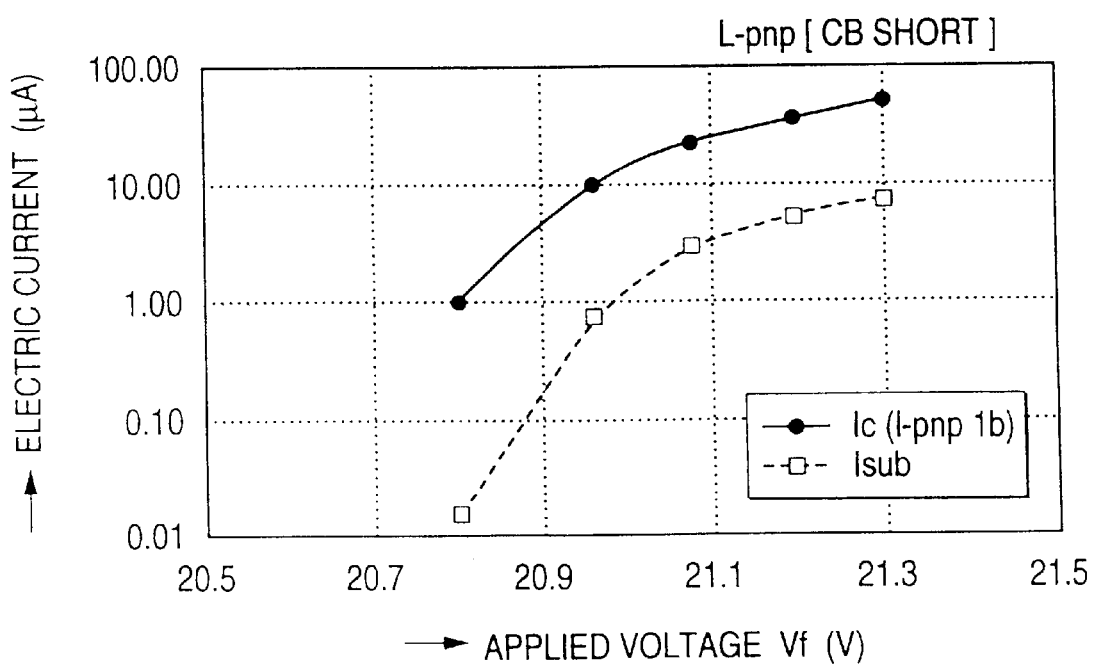
FIG. 14 is a graph showing the electric current of the diode and the leakage electric current of the planar junction type diode using the horizontal pnp bipolar transistor according to the embodiment of the invention shown in FIG. 12.

The characteristics of the applied voltage Vf and the leakage electric current are shown in FIG. 14 when a diode is constructed that is formed by commonly connected the base electrode 114b and the collector electrode 114c of the horizontal pnp bipolar transistor Q7 in order to relatively reduce the influence of the parasitic pnp bipolar transistor Q6. In FIG. 14, the abscissa is the applied voltage Vf supplied to the emitter electrode 110, which is graduated from 20.5 V to 21.5V by a step of 0.2 V, and the ordinate indicates the electric current Ic flowing in the collector electrode 114c and the leakage electric current Isub flowing in the p type semiconductor substrate (P-sub) 106, which is graduated in a logarithmic scale in the range of from 0.01 μA to 100 μA.

Figure 3:
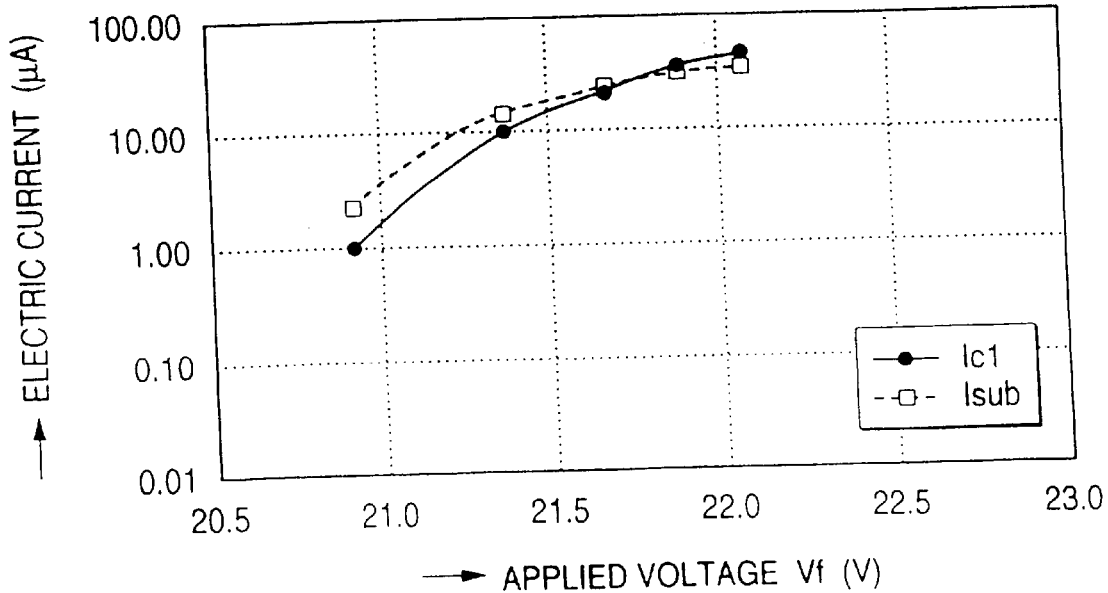
FIG. 3 is a graph showing the electric current of the diode and the leakage electric current of the planar junction type diode using the vertical npn bipolar transistor according to the conventional example shown in FIG. 1.

As shown in FIG. 14, when the applied voltage Vf is 20.8 V, the collector electric current Ic is about 1.0 μA, and the leakage electric current Isub is 0.01 μA, i.e., the leakage electric current is smaller by two digits. When the applied voltage Vf becomes 21.1 V, Ic is 30 μA, and Isub is 3 μA, i.e., Isub is smaller by one digit. Furthermore, when the applied voltage Vf becomes 21.3 V, Ic is 50 μA, and Isub is 8 μA, i.e., the leakage electric current is smaller, to make the ratio of Isub and Ic of from 1/7 to 1/100, so that the leakage electric current is reduced relative to the conventional example shown in FIG. 3.

In the semiconductor device described with reference to FIGS. 11 to 14, in order to suppress the leakage electric current (Isub) to the substrate, the N$^+$ sinker (PLG; plug) 105 as an impurity concentration region for withdrawing the base electrode has such a shape that surrounds the whole element, and also has such a shape that isolates the whole element from the substrate along with the N-BL 109.

The p type collector region 104 is provided to surround the periphery of the emitter region 101, and the p type collector region 104 and the N$^+$ sinker 105 are connected with the wiring 114, so that the electric current Ic2 flows by operating the horizontal pnp transistor between the emitter region 101 and the p type collector region 104. That is, Ic is the sum of Ic1 and Ic2.

Accordingly, when the potential difference between the emitter region 101 and the base region 105 is constant, the electric current value becomes large in comparison to the case where the p type impurity collector region 104 is not present, and when the collector electric current value (Ic) in this embodiment and the conventional embodiment is constant, the leakage electric current value (Isub) becomes relatively small in comparison to the conventional embodiment.

An embodiment of the third process for producing a semiconductor device will be described with reference to FIGS. 15A to 15C and FIGS. 16D and 16E. In this embodiment, a process for producing a semiconductor device having a planer junction type diode employing a horizontal pnp bipolar transistor (L-PNPTr).

Figure 15A:
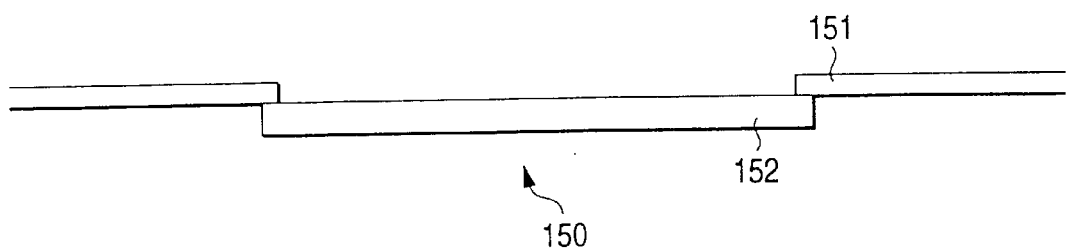
FIGS. 15A–15C is a schematic cross sectional view showing a process for producing a semiconductor device having a planar junction type diode using a horizontal pnp bipolar transistor according to an embodiment of the invention.

As shown in FIG. 15A, a high concentration base buried region 152 is formed on a p type semiconductor substrate (P-sub) 150 by solid phase diffusion of antimony (Sb). At this time, it can be also formed by using an arsenic (As) ion instead of antimony (Sb) by ion implantation.

Figure 15B:
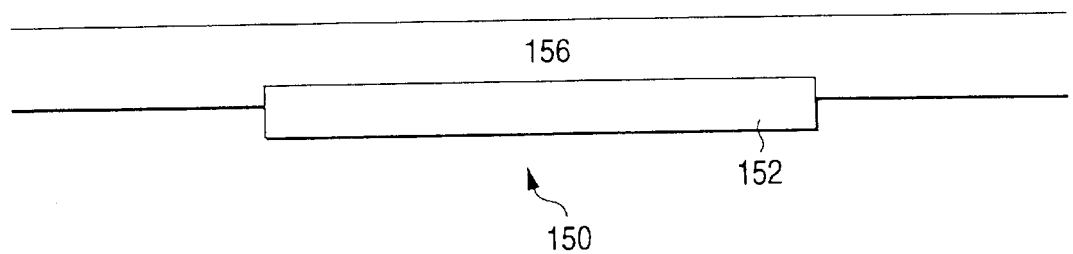

As shown in FIG. 15B, an n type epitaxial layer 156 of about 0.3 to 5.0 Ωcm is accumulated to a film thickness of from 0.5 to 2.0 μm.

Figure 15C:
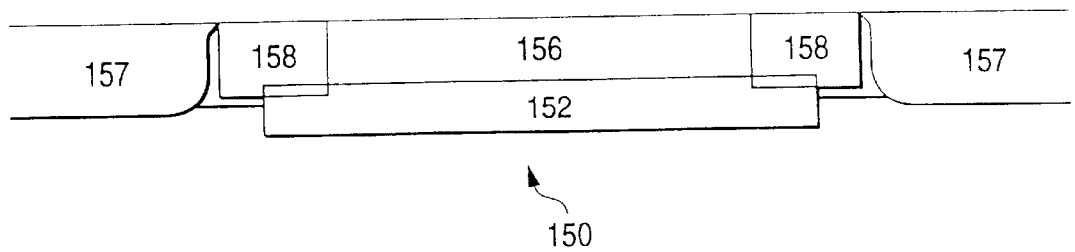
Figure 16D:
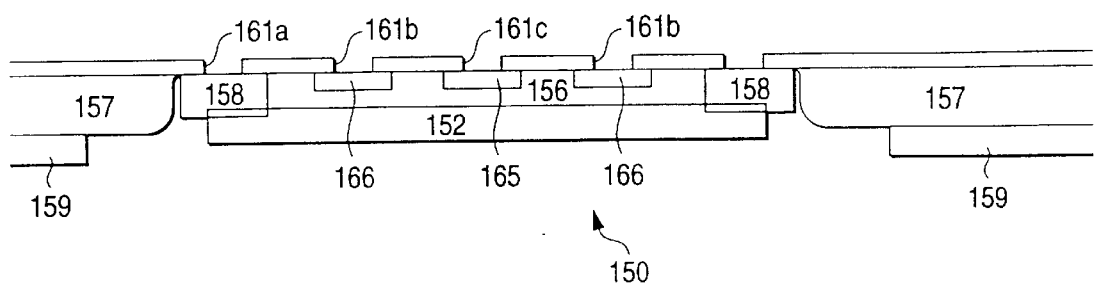
FIGS. 16D–16E is a schematic cross sectional view showing a process for producing a semiconductor device having a planar junction type diode using a horizontal pnp bipolar transistor according to an embodiment of the invention.

As shown in FIG. 15C, a LOCOS (oxide film) 157 is then formed as an element isolation region, an N$^+$ sinker 158 constituted by an n type diffusion layer connecting from the surface of the substrate to the base buried region 152 is formed, and the surface of the substrate is flattened. As shown in FIG. 16D, after forming a channel stopper 159 under the LOCOS (oxide film) 157, an SiO$_2$ film is accumulated to about 50 to 200 nm by a CVD method.

Subsequently, active regions 161a to 161c where elements are formed are selectively opened, and an impurity, for example a boron B$^+$ or BF$_2^+$ ion, is ion-implanted to an emitter region 165 and a collector region 166. In the case of ion implantation of a BF$_2^+$ ion, for example, the ion implantation energy is from 30 to 70 kev, and the dose amount is about from $1 \times 10^{15}$ to $1 \times 10^{16}$ atoms/cm$^2$.

Furthermore, an insulating film such as SiO$_2$ is accumulated to 200 to 500 nm by a CVD method, and a heat treatment at about 700 to 1,200° C. is conducted for 5 seconds to 2 hours, so as to form the emitter region 165 and the collector region 166.

Figure 16E:
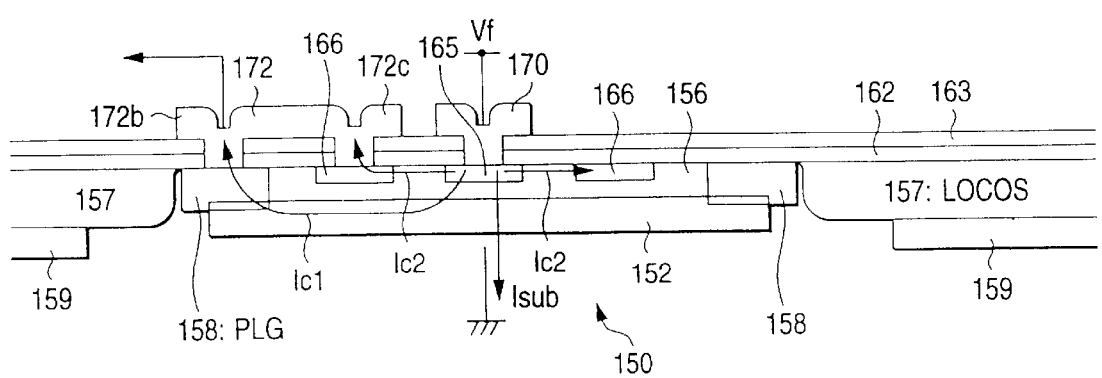

An opening 161c for an emitter electrode 170 of the L-PNPTr, an opening 161b for a collector electrode 172c, and an opening 161a for a base electrode 172b are opened, and then a barrier metal and an Al alloy are accumulated by sputtering, which worked by a photoresist technique and an RIE method, so as to form the emitter electrode 170, the base electrode 172b and the collector electrode 172c as shown in FIG. 16E. Furthermore, in the planar junction type diode using the horizontal pnp bipolar transistor, a bias voltage Vf is supplied to the emitter electrode 170 corresponding to an anode, and the collector electrode 172c and the base electrode 172b corresponding to a cathode are commonly connected and connected to an outer circuit.

As described in the foregoing, in the planar junction type diode using a horizontal pnp bipolar transistor, because an electric current Ic2 flowing from the emitter region 165 to the collector region 166 at the both ends thereof is added in addition to the normal diode electric current flowing from the emitter electrode 170 to the base electrode 172b, it is increased relatively with respect to the leakage electric current Isub flowing in the substrate (p type semiconductor substrate 150) of the parasitic pnp bipolar transistor. As a result, the ratio of leakage electric current/diode electric current becomes small, to improve the relative characteristics.

Therefore, according to the invention, the planar junction type diode using the vertical or horizontal bipolar transistor can be formed without extremely enlarging the cell area or increasing the number of steps in the production process, in comparison to the planar junction type diode diverting the conventional transistor structure. Furthermore, the leakage electric current to the substrate due to the operation of the parasitic pnp bipolar transistor is not increased, and thus the ratio of leakage electric current/diode electric current can be improved, and the resistance to latch up due to a leakage electric current to the substrate can be improved.

According to the process for producing a semiconductor device of the invention, a planer junction type diode using a vertical or horizontal bipolar transistor can be formed without extremely enlarging the cell area in comparison to the planer junction type diode employing the conventional transistor structure, and can be formed without increasing the steps of the production process. In the semiconductor device produced by the production process according to the invention, the leakage electric current to the substrate due to the operation of the parasitic pnp bipolar transistor is not increased, and thus the ratio of leakage electric current/diode electric current can be improved, and the resistance to latch up due to a leakage electric current to the substrate can be improved.

What is claim is:

1. A semiconductor device equipped with a trimming circuit having a Zener zap diode,
   said semiconductor device comprising a diode between a terminal for applying a voltage used on trimming said trimming circuit and said Zener zap diode,
   said diode comprising a first region of a first conductive type and a second region of a second conductive type which are formed on a substrate,
   said diode further comprising a third region of said second conductive type in at least a part of said first region,
   said third region being separated from said second region by said first region,
   said diode further comprising a fourth region of said first conductive type in at least in a part of said second region, said fourth region being separated from said first region by said second region, said third region being connected to said first region with wiring, and said fourth region being connected to said second region with wiring.

2. A semiconductor device as claimed in claim 1, wherein said first conductive type is a p type, and said second conductive type is an n type.

3. A semiconductor device as claimed in claim 1, wherein said diode is formed in such a manner that said first region is surrounded by said fourth region.

4. A semiconductor device as claimed in claim 2, wherein said first region comprises a base region of an npn transistor, said second region comprises a collector region of said npn transistor, said third region comprises an emitter region of said npn transistor, said fourth region comprises an independent region having the same structure as a base of said horizontal npn transistor, said collector region is connected to said fourth region with wiring, and said base region is connected to said emitter region with wiring.

5. A semiconductor device as claimed in claim 4, wherein said diode is formed in such a manner that said first region and said fourth region are surrounded by said second region and an n type plug region becoming a lead electrode of said second region.

6. A semiconductor device equipped with a trimming circuit having a Zener zap diode, said semiconductor device comprising a diode between a terminal for applying a voltage used on trimming said trimming circuit and said Zener zap diode, said diode comprising a first region of a first conductive type formed on a substrate and a second region of a second conductive type formed in said first region, said diode further comprising a third region of said second conductive type in at least a part of said first region, said third region being separated from said second region and other regions of said second conductive type by said first region, and said third region is connected to said first region with wiring.

7. A semiconductor device as claimed in claim 6, wherein said first conductive type is an n type, and said second conductive type is a p type.

8. A semiconductor device as claimed in claim 6, wherein said diode is formed in such a manner that said second region is surrounded by said third region.

9. A semiconductor device as claimed in claim 7, wherein said first region of an n type comprises a base region of a pnp transistor, said second region of a p type comprises an emitter region of said pnp transistor, said third region of a p type comprises a collector region of said pnp transistor, and said collector region is connected to said base region with wiring.

10. A semiconductor device as claimed in claim 9, wherein said diode is formed in such a manner that said second region and said third region are surrounded by said first region and an n type plug region becoming a lead electrode of said first region.

11. A process for producing a semiconductor device equipped with a trimming circuit having a Zener zap diode, and comprising a diode between a terminal for applying a voltage used on trimming said trimming circuit and said Zener zap diode, said process comprising a step of forming a buried region of a first conductive type in a semiconductor substrate, a step of forming a semiconductor layer of said first conductive type on said buried region, a step of forming a first region of a second conductive type in said semiconductor layer, a step of forming a second region of said first conductive type in said semiconductor layer, a step of forming a third region of said first conductive type in said first region, and a step of forming an electrode on said first region, said second region and said third region, to commonly connect said electrode on said first region and said third region.

12. A process for producing a semiconductor device as claimed in claim 11, wherein said first region is formed to be surrounded by said second region and said buried region.

13. A process for producing a semiconductor device as claimed in claim 11, wherein a p type impurity is used as an impurity of said second conductive type for forming said first region, and an n type impurity is used as an impurity of said first conductive type for forming said second region and said third region.

14. A process for producing a semiconductor device equipped with a trimming circuit having a Zener zap diode, and comprising a diode between a terminal for applying a voltage used on trimming said trimming circuit and said Zener zap diode, said process comprising a step of forming a buried region of a second conductive type in a semiconductor substrate, a step of forming a semiconductor layer of said second conductive type on said buried region, a step of forming a first region of a first conductive type and a fourth region of said first conductive type in said semiconductor layer, a step of forming a second region of said second conductive type on said semiconductor layer, a step of forming a third region of said second conductive type in said first region of said first conductive type, a step of forming an electrode on said first region and said third region, to commonly connect thereto, and a step of forming an electrode on said second region and said fourth region, to commonly connect thereto.

15. A process for producing a semiconductor device as claimed in claim 14, wherein said first region is formed to be surrounded by said second region and said buried region.

16. A process for producing a semiconductor device as claimed in claim 14, wherein said first region is formed to be surrounded by said fourth region.

17. A process for producing a semiconductor device as claimed in claim 14, wherein a p type impurity is used as an impurity of said first conductive type for forming said first region and said fourth region, and an n type impurity is used as an impurity of said second conductive type for forming said second region and said third region.

* * * * *